(12) United States Patent
Takigami

(10) Patent No.: US 6,365,841 B1
(45) Date of Patent: Apr. 2, 2002

(54) PRINTED CIRCUIT BOARD WITH RESIST COATING DEFINING REFERENCE MARKS

(75) Inventor: Kotaro Takigami, Asaka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/116,947

(22) Filed: Jul. 17, 1998

(30) Foreign Application Priority Data

Jul. 17, 1997 (JP) .............................................. 9-192171

(51) Int. Cl.[7] ................................................ H05K 1/16
(52) U.S. Cl. ........................ 174/260; 174/250; 174/260; 361/783; 361/811; 361/808; 361/767
(58) Field of Search .................................. 174/250, 260; 361/760, 767, 771, 777, 779, 783, 808, 811

(56) References Cited

U.S. PATENT DOCUMENTS 3,775,844 A * 12/1973 Parks .......................... 29/830
5,512,712 A *  4/1996 Iwata et al. ................. 174/258
5,912,438 A *  6/1999 Kubin ......................... 174/250

* cited by examiner

*Primary Examiner*—Kamand Cuneo

(57) ABSTRACT

A printed circuit board includes a first mark 2 formed by a thin conductor, a second mark 3 formed by a resist 8, a land 6 which is partially coated by the resist 8 and a land 7 which is not coated by the resist 8. The second mark 3 is formed when the land 6 is partially coated by the resist 8. A device 4, which corresponds to the land 6, is mounted at a position apart from a center O2 of the second mark 3 by a predetermined distance L1. A device 5, which corresponds to the land 7, is mounted at a position apart from a center O1 of the first mark 2 by a predetermined distance L2. Therefor, the devices 4, 5 can be properly mounted on the printed circuit board 1 in spite of a positional error of the resist 8.

16 Claims, 4 Drawing Sheets

PRINTED CIRCUIT BOARD WITH RESIST COATING DEFINING REFERENCE MARKS

FIELD OF THE INVENTION

This invention relates to a printed circuit board (PCB) including a mark which is used as a recognition of an origin for mounting by a mounter. More specifically, this invention relates to a technique which enables proper mounting of devices, on the printed circuit board, including a land which is partially coated with a resist and a land which is not coated with the resist, even if the resist is coated on the printed circuit board at an improper position.

BACKGROUND

As shown in FIG. 2, a mark 2 made of a conductive leaf or a thin conductor is formed on a prior art printed circuit board 10. When a mounter mounts devices 4, 5 such as electric parts on the printed circuit board 10, the mark 2 is recognized and used as an origin for mounting by the mounter. The mounter is a machine which is used for mounting devices on the printed circuit board. In FIG. 2, a symbol O1 denotes a central point of the mark 2, a symbol 6' denotes a land on which the device 4 is mounted, a symbol 7 denotes a land on which the device 5 is mounted, and a symbol 8 denotes a resist material (a solder resist). In FIG. 2, there is shown a separation between the outer boundaries of lands 6' and 7, and the respective boundaries of the surrounding resist 8. In the prior art, the resist 8 is generally coated on the printed circuit board 10 except for the mark 2, the land 6' and the land 7 respectively.

It will be explained how the mounter mounts the devices 4, 5 on the printed circuit board 10. For the sake of simplicity, only a position in a horizontal direction X, shown in FIG. 2, is considered.

Before mounting the devices 4, 5, the mounter detects the center O1 of the mark 2 from an output of a sensor such as a CCD camera. Then, the mounter mounts the device 4 on a position apart from the center O1 by a distance L1 and also mounts the device 5 on another position apart from the center O1 by a distance L2. These distance values L1 and L2 are previously registered on a data-base provided with the mounter. The value L1 is predetermined, by a design-specification for the printed circuit board 10, as a distance from the center O1 of the mark 2 to a center of the land 6' and the value L2 is also predetermined, by the design-specification for the printed circuit board 10, as a distance from the center O1 of the mark 2 to a center of the land 7. Therefore, as far as the resist 8 is coated on the printed circuit board 10 except for the the land 6' and the land 7, the devices 4 and 5 are properly mounted on the land 6' and the land 7 respectively.

However, as shown FIG. 3(B), in a case that the resist 8 is partially coated onto the land 6, a position error of the device 4 occurs in its mounting for following reasons (1)~(6). In this case, for the sake of simplicity, only a position in a horizontal direction X, shown in FIG. 3(A) or FIG. 3(B), is considered.

(1) The resist 8 is coated on the printed circuit board 10, which is already provided with the mark 2 and the lands 6, 7, through a mask (not shown) which is put on the board 10. It is assumed that the mask is formed so as to coat the resist 8 on the land 6 except for its central area 6A, and so as to avoid the land 7 by a sufficient clearance and avoid the mark 2 by an extremely sufficient clearance from the resist 8, respectively.

(2) Therefore, if there occurs a few positional errors between the printed circuit board 10 and the mask, a center of the exposed area 6A, which is not coated with the resist 8 out of the land 6, shifts from a center of the land 6 itself.

(3) FIG. 3(A) shows a proper relation between the printed circuit board 10 and the mask. In this case, since the center of the exposed area 6A coincides with the center of the land 6 itself, the center of the exposed area 6A is located at the distance L1 apart from the center O1 of the mark 2, and the device 4 is properly mounted on the exposed area 6A of the land 6.

(4) On the other hand, FIG. 3(B) shows an improper relation between the printed circuit board 10 and the mask. As shown in FIG. 3(B), if the resist 8 is coated with a position error ΔL1 against the printed circuit board 10, the center of the exposed area 6A is shifted by ΔL2 from the center of the land 6 itself. Therefor, since the mounter mounts the device 4 at the distance L1 from the center O1 of the mark 2, the device 4 is not properly mounted on the exposed area 6A.

(5) Regarding the land 7, the mask is generally designed so that the minimum gap is assured between the land 7 and the resist 8, even if the mask is shifted a little against the printed circuit board 10. In FIG. 3(B), this minimum gap is illustrated by the left boundaries of the lands 7 being located nearly at the boundary of the resist 8, while the separation between the right boundaries of the lands 7 and the boundary of the resist 8 has increased relative to FIG. 3(A). Therefor, the device 5 is properly mounted on the land 7 in spite of the positional error of the resist 8.

(6) Regarding the mark 2, the mask is generally designed so that a sufficiently wide gap is assured between the mark 2 and the resist 8, even if the mask is largely shifted against the printed circuit board 10. Therefore, the center O1 of the mark 2 is not shifted by the positional error of the resist 8.

SUMMARY OF THE INVENTION

An object of the present invention is to provide a printed circuit board and a method, each of which enables proper mounting of devices on the printed circuit board having a land which is partially coated with a resist and a land which is not coated with the resist, even if the resist is shifted against the printed circuit board.

In a preferred embodiment, the present invention is directed to a printed circuit board having a first mark which is formed by a thin conductor or a conductive leaf for mounting a device, a land being partially coated with a resist and a land being not coated with the resist, wherein said printed circuit board further comprises a second mark formed by said resist which is coated on the printed circuit board together with said land being partially coated.

These and other objects of the present application will become more readily apparent from the detailed description given hereafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and the accompanying drawings which are given by way of illustration only and wherein.

DESCRIPTION OF THE PREFERRED EMBODIMENT

Figure 1:
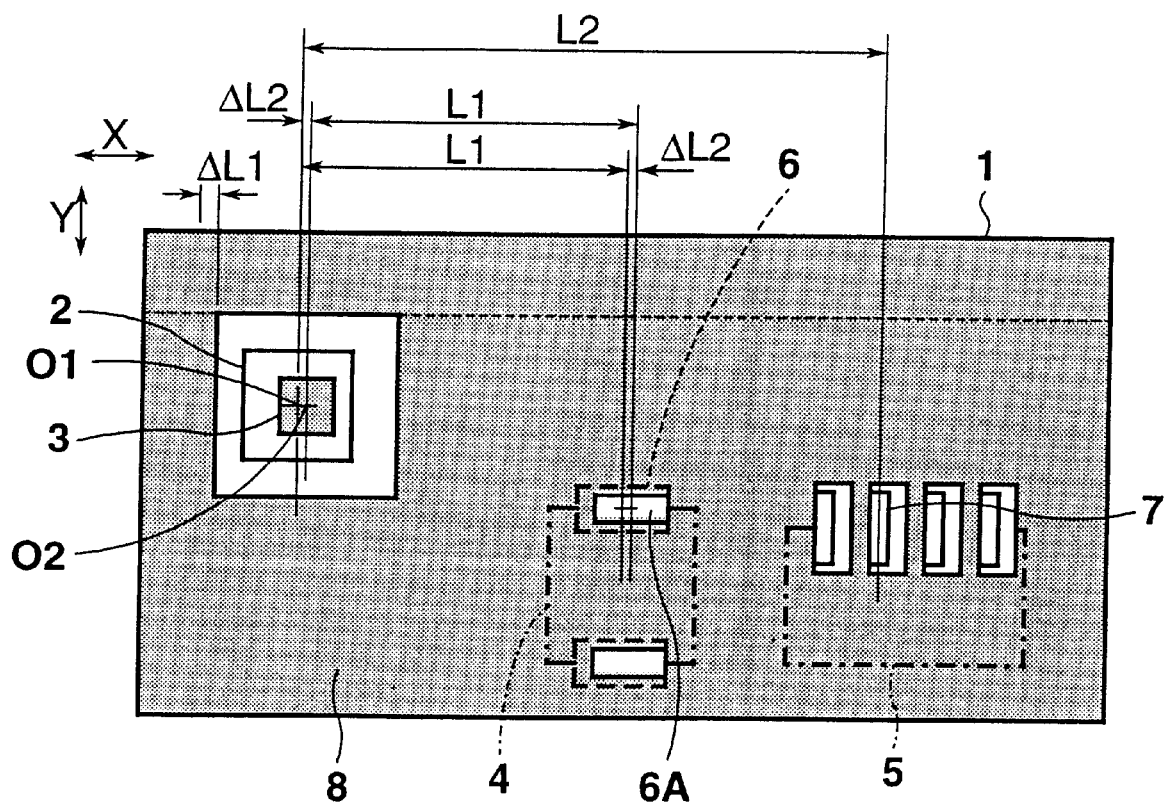
FIG. 1 shows a plan view of a printed circuit board as an embodiment of the present invention.
Figure 2:
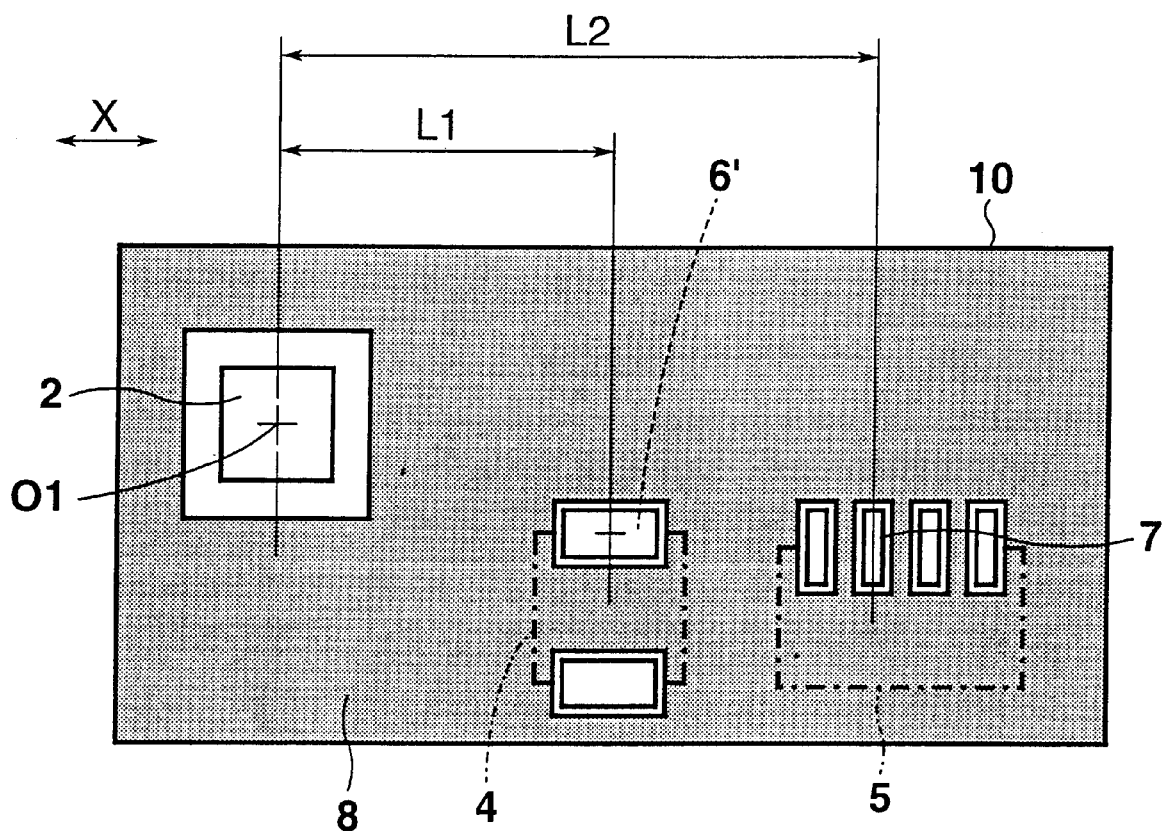
FIG. 2 shows a plan view of a prior art printed circuit board.

Referring to FIG. 1, an embodiment of the present invention will be explained.

FIG. 1 shows a printed circuit board 1 (the mounting means) as an embodiment of the present invention. The printed circuit board 1 is provided with a first mark 2 made of a conductive leaf or a thin conductor such as a thin copper, a second mark 3 (the reference means) formed by a resist (a solder resist) 8, a land 6 and a land 7. It is assumed that a device 4 is mounted on the land 6 and a device 5 is mounted on the land 7. For example, these devices 4, 5 are electronic parts. The resist 8 is coated on the printed circuit board 1, which is already provided with the first mark 2, the land 6 and the land 7, through a mask (not shown) which is put on the printed circuit board 1. As a result, the second mark 3 made of the resist 8 is formed on the printed circuit board 1. An area with oblique lines in FIG. 1 indicates the resist 8 coated on the printed circuit board 1.

In the present embodiment, the second mark 3 made of the resist 8 is formed on a central area of the first mark 2 made of the thin conductor.

In the present embodiment, the printed circuit board 1 and the mask for coating the resist 8 are designed as follows.

(1) Regarding only the land 6, the resist 8 is coated on and around the land 6, except for a central area 6A of the land 6.

Figure 3A:
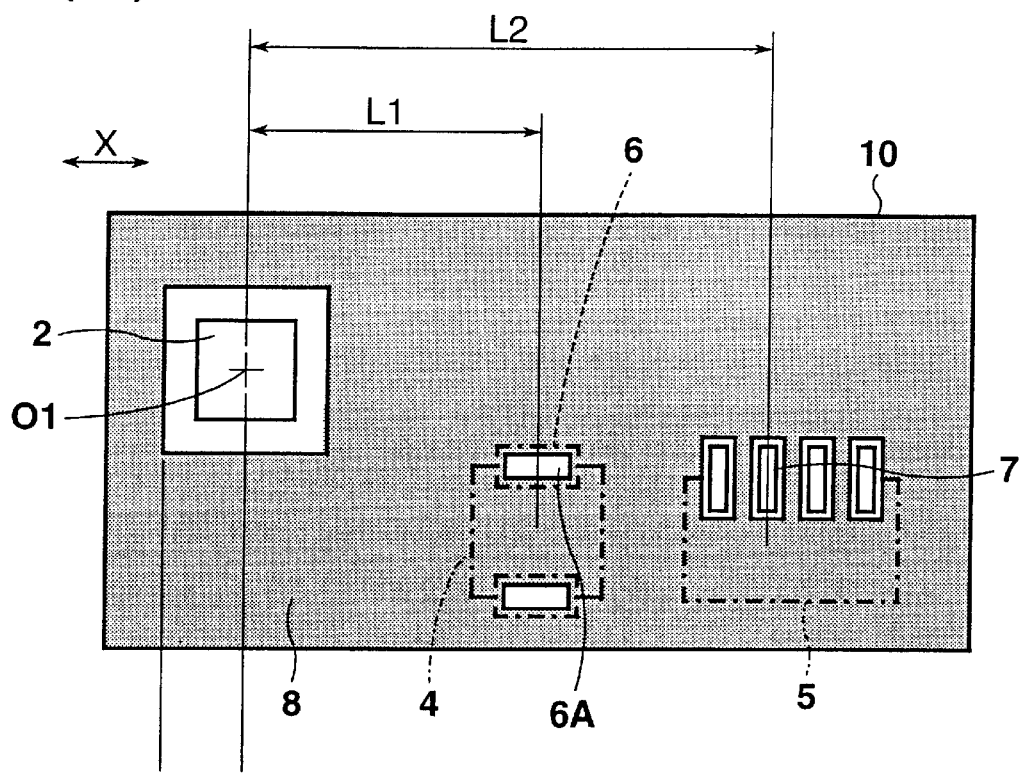
FIGS. 3(A) and 3(B) show a problem in the prior art.
Figure 3B:
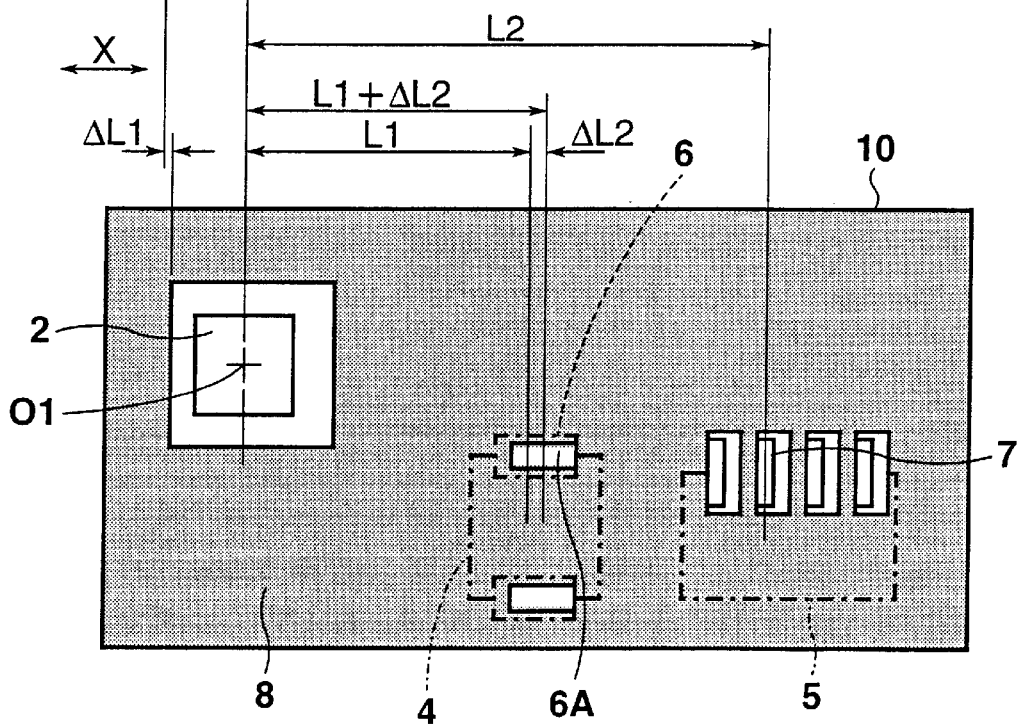
Figure 4:
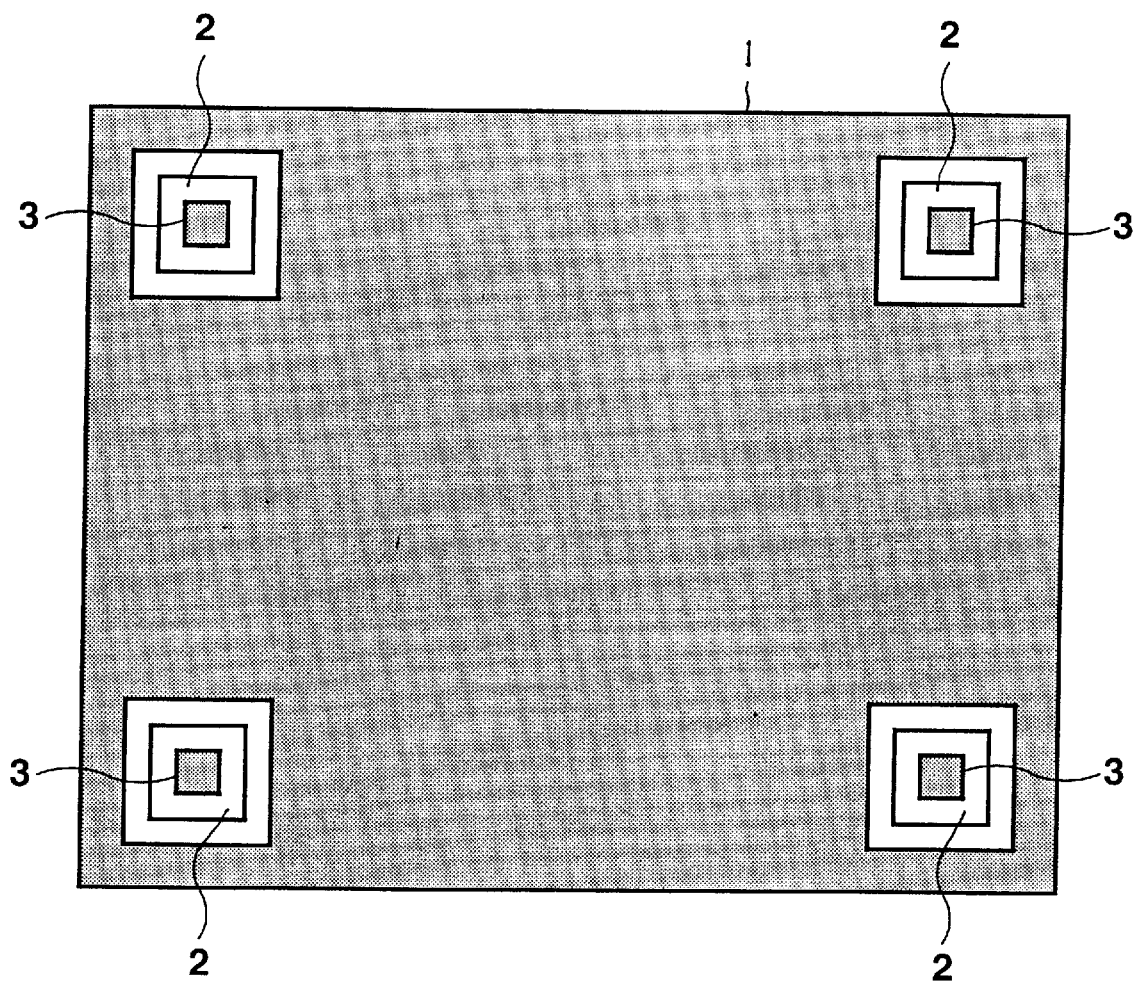
FIG. 4 shows a plan view of a printed circuit board having four sets of marks at its corners.

(2) Regarding the land 7, the resist 8 is not coated on the land 7. Namely, the resist 8 is coated on the printed circuit board 1, except for the land 7. Namely, the resist 8 is coated on an outer area sufficiently apart from a circumference of the land 7 so as to avoid the land 7 with the minimum clearance. In FIG. 1, as in FIG. 3(B), this minimum gap is illustrated by the left boundaries of the lands 7 being located nearly at the boundary of the resist 8, while the separation between the right boundaries of the lands 7 and the boundary of the resist 8 has increased relative to, for example, FIG. 3(A).

(3) Regarding the first mark 2 made of the thin conductor, the resist 8 is coated on a central area of the first mark 2 while enough of a gap is assured between the central area and a circumference of the first mark 2.

(4) The resist 8, which is coated on the central area of the first mark 2 made of the thin conductor, forms the second mark 3. According to a design of the printed circuit board 1 and the mask, the central point O1 of the first mark 2 made of the thin conductor coincides with a central point O2 of the second mark 3 made of the resist 8.

(5) Regarding an outside of the first mark 2 made of the thin conductor, the resist 8 is coated on an area sufficiently apart from a circumference of the first mark 2 so as to avoid the first mark 2 with an extremely sufficient clearance.

The devices 4, 5 are mounted on the printed circuit board 1 as follows. In this case, for the sake of simplicity, only a position in a horizontal direction X, shown in FIG. 1, is considered.

(1) Before devices 4, 5 are mounted, the mounter detects the center O1 of the first mark 2 made of the thin conductor and the center O2 of the second mark 3 made of the resist 8 from an output signal of a sensor such as a CCD camera.

(2) Then, the mounter initially mounts the device 4 at the distance L1 apart from the center O2 of the second mark 3 made of the resist 8, and next mounts the device 5 at the distance L2 apart from the center O1 of the first mark 2 made of the thin conductor. On the other hand, the mounter initially mounts the device 5 at the distance L2 apart from the center O1 of the first mark 2 made of the thin conductor, and next mounts the device 4 at the distance L1 apart from the center O2 of the second mark 3 made of the resist 8.

These distance values L1 and L2 corresponding to the devices 4, 5 are previously registered on a data-base provided with the mounter. The reason is that the value L1 is predetermined, by a design-specification for the printed circuit board 1, as a distance from the center O1 of the first mark 2 to the center of the land 6 which is partially coated by the resist 8, and that the value L2 is also predetermined, by the design-specification for the printed circuit board 1, as a distance from the center O1 of the first mark 2 made of the thin conductor to a center of the land 7 which is not coated by the resist 8.

The mounter is programed as follows.

(1) In a case that the mounter mounts a device on the land 6 which is partially coated by the resist 8, the mounter uses, as an origin or a reference point for mounting the device, the center O2 of the second mark 3 formed by the resist 8.

(2) In a case that the mounter mounts a device on the land 7 which is not coated by the resist 8, the mounter uses, as an origin or a reference point for mounting the device, the center O1 of the first mark 2 formed by the thin conductor.

As a result, the devices 4 and 5 are properly mounted on the land 6 and the land 7 respectively, even if a positional relationship between the printed circuit board 1 and the mask is improper when the resist 8 is coated.

Namely, as shown in FIG. 1, if the resist 8 is shifted by ΔL1 against the printed circuit board 1, the center of the exposed area 6A of the land 6, which is partially coated by the resist 8, is shifted by ΔL2 from the center of the land 6 itself. At the same time, the center O2 of the second mark 3 formed by the resist 8 is also shifted by ΔL2 in the same direction from the center O1 of the first mark 2 formed by the thin conductor. Therefore, a distance, which is measured from the center O2 of the second mark 3 to the center of the exposed area 6A, is ΔL2 as designed. Therefore, the device 4 can be properly mounted on the exposed area 6A of the land 6.

On the other hand, regarding the land 7 which is not coated by the resist 8, the device 5 can be properly mounted on the land 7 because the minimum gap is assured between the resist 8 and the land 7, even if there is some positional error between the printed circuit board 1 and the mask.

In a vertical direction Y, shown in FIG. 1, the devices 4, 5 are properly mounted on the exposed area 6A of the land 6 and the land 7 respectively in spite of the positional error of the resist 8 for the same reason mentioned above.

In the above-mentioned embodiment, since only one set of the first mark 2 formed by the thin conductor and the second mark 3 formed by the resist 8 inside the first mark 2 is provided on the printed circuit board 1, it is valid to properly mount the device 4 in a case of a parallel shift or a parallel movement of the resist 8 against the printed circuit board 1. Generally, in a case that the resist 8 is rotated against the printed circuit board 1, it is very valid to form, at every corner of two or three or four corners of the printed circuit board 1, one set of the first mark 2 and the second mark 3.

While the second mark 3 made of the resist 8 is formed on the central area of the first mark 2 made of the thin conductor in the above-mentioned embodiment, it is possible to form the second mark 3 completely apart from the first mark 2. Further, it is possible to form the second mark 3 so that only a part of the second mark 3 overlaps on the first mark 2. The reason is that the center O2 of the second mark 3 is used as the origin or the reference point in the case of mounting a device on the exposed area 6A of the land 6 which is partially coated with the resist 8, and that the center O1 of the first mark 2 is used as the origin or the reference point in the case of mounting a device on the land 7 which is not coated by the resist 8. Still further, while an each shape of the marks 2, 3 is quadrangular in the above-mentioned embodiment, other marks such as a triangular mark and a circular mark, for example, can be used respectively.

According to the present invention, a first mark formed by a thin conductor and a second mark formed by a resist are provided with a printed circuit board which has a land being partially coated by a resist and a land not coated by the resist. Then, it is possible to use the first mark as an origin for mounting a device which must be mounted on the land not coated by the resist, and it is also possible to use the second mark as an origin for mounting a device which must be mounted on the land being partially coated by the resist. Therefore, it becomes possible to properly mount the devices on the printed circuit board in spite of a positional error of the resist.

According to the present invention, a center of a first mark formed by a thin conductor and a center of a second mark formed by a resist are detected before mounting devices by using a mounter. Then the device, which corresponds to a land being partially coated by the resist, is mounted at a position apart from the center of the second mark by a predetermined distance, and the device, which corresponds to a land not coated by the resist, is mounted at a position apart from the center of the first mark by a predetermined distance. Therefore, it becomes possible to properly mount the devices on the printed circuit board in spite of a positional error of the resist.

The invention being thus described, it will be apparent that the same may be varied in many ways. Such variations are not to be regarded as a departure from the spirit and scope of the invention, and all such modifications as would be obvious to one skilled in the art are intended to be included within the scope of the following claims.

I claim:

1. A printed circuit board, comprising:
   a first land, partially coated with a resist which defines an uncoated area, for mounting a first device thereon, the first land being formed of a conductor;
   a second land, not coated with the resist, for mounting a second device thereon, the second land being formed of the conductor;
   a first mark, formed by said resist, for use in mounting the first device on the uncoated area of the first land;
   a second mark, formed of said conductor, for use in mounting the second device on the second land;
   a first device mounted a first distance from the first mark on a center of the uncoated area of the first land; and
   a second device mounted a second distance from the second mark on a center of the second land.

2. The printed circuit board claimed in claim 1, wherein said first and second marks are completely separated from each other.

3. The printed circuit board claimed in claim 1, wherein said first and second marks are partially overlapped with each other.

4. The printed circuit board claimed in claim 1, wherein said first mark is one of a quadrangle, circle and triangle shape, and said second mark is also one of a quadrangle, circle and triangle shape.

5. The printed circuit board claimed in claim 1, wherein said first mark is formed on a central area of the second mark.

6. The printed circuit board claimed in claim 5, wherein said first and second marks are quadrangular in shape.

7. The printed circuit board claimed in claim 5, wherein a plurality of sets of said first and second marks are formed.

8. The printed circuit board claimed in claim 5, wherein a set of said first and second marks are formed at each corner of four corners on the printed circuit board.

9. A printed circuit board for facilitating device placement thereon, comprising:
   at least one first land, partially coated with a resist, for mounting a first device thereon, the first land being formed of a conductor;
   at least one second land, not coated with the resist, for mounting a second device thereon, the second land being formed of the conductor;
   a first reference mark, formed of the resist, defining a first reference position used in mounting the first device on the first land; and
   a second reference mark, formed of the conductor, defining a second reference position used in mounting the second device on the second land.

10. The printed circuit board as in claim 9, wherein the first reference position is at a center of the first reference mark, and the second reference position is at a center of the second reference mark.

11. The printed circuit board as in claim 9, wherein the first reference mark is located on top of and within a perimeter of the second reference mark.

12. The printed circuit board as in claim 9, wherein the first and second reference marks are at a corner of the printed circuit board.

13. The printed circuit board as in claim 9, wherein the first reference position is one which remains a constant distance from a center of an area of the first land and not coated with the resist, even when the resist is misaligned.

14. The printed circuit board as in claim 9, further comprising:
   a first device mounted a first distance from the first reference position on a center of an uncoated area of the first land; and
   a second device mounted a second distance from the second mark on a center of the second land.

15. A printed circuit board for facilitating device placement thereon, comprising:
   a mounting means for receiving a device, the mounting means being partially covered with a resist, the resist defining a mounting area on the mounting means;
   a reference means for defining a reference position which remains a constant distance from a center of the mounting area when the resist and the mounting area are shifted, the reference position being used in mounting the device on the mounting area; and
   a device mounted on the center of the mounting area.

16. The printed circuit board as in claim 15, wherein the reference means is made of the resist.

* * * * *